April 25, 1967 R. I. HARRISON ETAL 3,316,494

SEMICONDUCTOR MICROWAVE POWER DETECTOR

Filed May 4, 1964

INVENTORS
RICHARD I. HARRISON
JOSEPH ZUCKER

BY

R. J. Frank
ATTORNEY.

United States Patent Office 3,316,494
Patented Apr. 25, 1967

3,316,494
SEMICONDUCTOR MICROWAVE POWER DETECTOR

Richard I. Harrison, Jericho, and Joseph Zucker, Queens, N.Y., assignors to General Telephone and Electronics Laboratories, Inc., a corporation of Delaware Filed May 4, 1964, Ser. No. 364,609
4 Claims. (Cl. 329—161)

This invention relates to apparatus for detecting microwave power and more particularly to apparatus utilizing the bulk thermoelectric effect of "hot carriers" in semiconductor material therefor.

The increased use of higher frequencies for electromagnetic power transmission, both modulated and unmodulated, in recent years has created a great need for rugged, reliable power detection devices capable of operation over a broad band of frequencies at both high and low power levels. During normal operation, power detection apparatus inserted in a waveguide should exhibit a minimum variation in electrical impedance at different microwave power levels to insure that highly accurate measurements may be attained.

Power detecting or measuring apparatus employing many types of semiconductor materials are known. However, these devices are primarily junction-type semiconductor apparatus and do not rely on a bulk effect of a particular semiconductor. Therefore, the devices have been found to exhibit significant variations in electrical impedance when subjected to different microwave power levels. This variation is due in part to the field-dependent capacitance exhibited by junction-type devices and has been found to reduce the effective frequency band and power range in which accurate measurements may be made. In addition, junction-type devices are generally more temperature sensitive than bulk effect semiconductor devices. Also, their impedance varies significantly with changes in environmental conditions, such as temperature, humidity, exposure to gases, etc., due to the changes in the surface conditions of the semiconductor material.

The present invention is directed to the provision of a novel high-frequency power detection device capable of detecting the level of electromagnetic power in a waveguide and/or the amplitude modulation thereof with a high degree of accuracy. Also, the apparatus can be operated as a mixer of microwave signals if so desired.

This device utilizes the bulk thermoelectric effect of "hot carriers" in a wafer of semiconductor material having a low carrier concentration to provide either an indication of the power level of a high frequency signal or the amplitude modulation thereon as desired for a particular application. As known in the art, the bulk thermoelectric effect generates an electromotive force as a result of the preferential diffusion of "hot carriers" therein and is independent of the presence of inhomogenieties in the semiconductor such as junctions and Schottky barriers. By employing a bulk semiconductor effect, the apparatus is found to be more rugged than junction-type semiconductor demodulators and less susceptible to burn out due to high overload powers. Also, the device is readily adapted for use with standard microwave crystal mounts and is found to be easier to manufacture than known devices.

In addition the performance of the present apparatus is found to be less subject to ambient or environmental changes than known devices performing similar operations. This improved performance is due in part to the utilization of the bulk effect of the semiconductor wafer, so that detection is substantially independent of the semiconductor surface conditions. Also, the invention is primarily a dissipative element, having only the field-independent lattice capacitance inherent in semiconductor materials, thereby permitting accurate measurements to be made at different power levels over a wide frequency range.

In accordance with the present invention a semiconductor wafer is provided with two ohmic metal contacts. These contacts are positioned on opposing faces of the wafer and define substantially different contact areas with the wafer. The probe or small area contact is selected or treated so that when contacting the wafer no Schottky barrier or p-n junction is established therebetween. The region of the semiconductor immediately under the probe will then have a majority carrier of the same type, either holes or electrons, as the entire semiconductor wafer. The probe therefore acts as a non-injecting contact to enable the invention to effectively utilize the bulk effect of the semiconductor wafer.

The wafer and associated contacts are then placed in the waveguide in which power is to be detected. When so placed, microwave power is coupled through the probe which acts to concentrate the power in the small region of the semiconductor wafer adjacent thereto. Thus, a region of large power density is established in that volume of the wafer proximate the probe. The carriers in this region of high power density absorb power and due to the relatively low carrier concentration of the wafer, the carriers attain a higher temperature than the semiconductor crystal lattice.

The electrical path is completed through the large area contact on the opposing face of the semiconductor wafer. The power density in the region of the semiconductor wafer proximate this contact is substantially less than at the probe due to the difference in contact areas. The power per carrier is also substantially less and as a result, the carriers in this region proximate the large area contact remain essentially at the temperature of the semiconductor crystal lattice.

Thus, a temperature gradient exists within the semiconductor wafer causing the diffusion of "hot" carriers to regions wherein the carriers are not heated. The resultant change in charge distribution due to "hot" carrier diffusion generates a thermoelectric voltage between the two ohmic contacts. This voltage is a function of the microwave power in the waveguide and may be readily supplied to external reading means as desired.

Further features and advantages of the invention will become more readily apparent from the following description of specific embodiments, as shown in the accompanying drawings in which.

Figure 1:
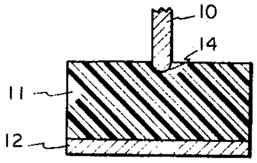
FIG. 1 is a view in section of one embodiment of the invention.

Referring more particularly to the embodiment shown in FIG. 1, probe 10 is shown with tip 14 contacting semiconductor wafer 11. Wafer 11 is formed of a single crystal semiconductor material such as germanium, silicon or the like. The semiconductor material is preferably lightly-doped by the addition of impurities to make either a p-type or n-type extrinsic semiconductor wafer. As is known in the art, impurities from Group III of the Periodic Table will provide a p-type wafer while those of Group V provide an n-type wafer. However, intrinsic semiconductor material may be employed if desired.

The majority carriers of the semiconductor wafer become "hot carriers" when the average energy of the carriers exceeds the energy of the associated lattice. Depending on the majority carrier of the intrinsic semiconductor material employed or the type of doping used, these carriers may be either "hot holes" or "hot electrons."

The carrier concentration of wafer 11 is selected to be less than $10^{16}$ carriers per cubic centimeter at room temperatures. This relatively light doping level is chosen to insure that each carrier will absorb a significant portion of the electromagnetic power applied to a unit volume of semiconductor. As the carrier concentration of wafer 11 is reduced, the power available per carrier increases and for reasons that will later become apparent, the sensitivity of the device is also increased.

Probe or contact 10 is a metal probe, such as tungsten, selected or treated such that no Schottky barrier or p-n junction is formed when it contacts wafer 11. Therefore probe 10 forms what is commonly referred to as a non-injecting contact.

The opposing face of wafer 11 is shown contacting metallic base or contact 12. This contact is of substantially greater area than that of probe 10 and preferably is also an ohmic or non-rectifying contact. However, as will be pointed out later in the specification, metallic base or contact 12 is positioned in a region of generally low power density so that other contacts exhibiting a low impedance at the frequencies of interest may be employed.

The electrical impedance of the invention as seen from the above discussion is the sum of the linear impedances of the contacts and the bulk semiconductor wafer. By eliminating the need for a barrier or junction, the device acts as a dissipative element of substantially constant impedance. Although lattice capacitance is inherent in semiconductor material, it is a field-independent capacitance and remains substantially constant thereby permitting measurements to be made over a wide frequency band and power range.

Figure 2:
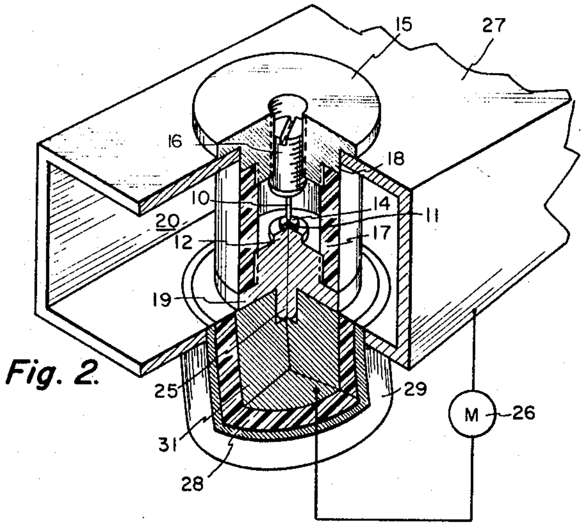
FIG. 2 is a view in section of the embodiment shown in FIG. 1 mounted in a waveguide.

As shown in FIG. 2, the embodiment of FIG. 1 is mounted in a suitable microwave crystal mount. This type of cartridge may be easily inserted in a waveguide by either providing a threaded arrangement or friction fit as particularly desired. The flange 15 of top member 18 will engage the wall of the waveguide 27 thereby placing wafer 11, probe 10, and base contact 12 in the electric fields present in the waveguide. Rounded extension 25 of end piece 19 is seen contacting the center conductor 31 of the dielectric 28 filled coaxial line in which outer conductor 29 is connected to waveguide 27.

Although metal base contact 12 may be formed as an integral part of wafer 11, it is shown in FIG. 2 as part of end piece 19 of the cartridge with the wafer mounted thereon. End piece 19 is connected to and insulated from top member 18 by threaded insulating jacket 17. Probe 10 is shown affixed to screw member 16 to insure proper contact between tip 14 and semiconductor wafer 11. While a rounded tip 14 is shown on probe 10, it will be understood that other tip configurations may be used to provide a small contact area between the probe and wafer.

During normal usage, cartridge 20 is inserted into the broad wall of a waveguide containing microwave power of the fundamental transverse electric or TE mode. The cartridge extends across the waveguide parallel to the narrow dimension placing probe 10 in position to couple the electromagnetic power therein through semiconductor wafer 11.

To insure proper location in the waveguide, an external tuning circuit may be used to maximize the electric field at the point of insertion. If the major dimension of the contact area of tip 14 of probe 10 is a small fraction, such as $1/15$ of the wavelength of the microwave power, it is then possible to tune the waveguide so that the electric field is maximized at the tip 14 by the use of tuners, open or short circuits as well known in the electrical art.

The electromagnetic power will be coupled through probe 10 and tip 14 into the small volume of wafer 11 proximate the contact area of tip 14. The majority carriers, either holes or electrons, contained in this small volume of wafer 11 will absorb power and experience a sharp increase in average energy. Since the carrier concentration in this volume of wafer lies in the lightly-doped region of less than $10^{16}$ carriers per cubic centimeter, each carrier therein will accordingly absorb a significant portion of the concentrated electric power.

The electromagnetic power flows through wafer 11 and broad area contact 12 completing the electrical path to the opposing wall of the waveguide. The contacting area of contact 12 is selected to be at least 10 times as great as that of tip 14 of probe 10. Thus, the power density in that volume of wafer 11 adjacent contact 12 is substantially less than in the volume adjacent probe 10.

Since the broad area contact 12 is located at a region of relatively low power density, the carriers residing in the adjacent portion of wafer 11 do not absorb energy at a rate exceeding the rate at which they can transfer energy to the lattice and therefore experience no measurable increase in average energy. These carriers are maintained essentially in thermal equilibrium with the lattice of the semiconductor wafer and do not become "hot carriers."

The lattice temperature is found to be substantially constant throughout semiconductor wafer 11 so that a carrier temperature gradient exists within the wafer 10 due to the absorption of energy by those carriers proximate tip 14. This temperature gradient and uneven heating of the carriers result in a diffusion of the more energetic carriers in the region of high power density to regions of low power density, and in this embodiment to broad area contact 12.

The redistribution or diffusion of the carriers serves to generate a thermoelectric voltage between contacts 10 and 12 which is a function of the electromagnetic power coupled into wafer 11.

Figure 3:
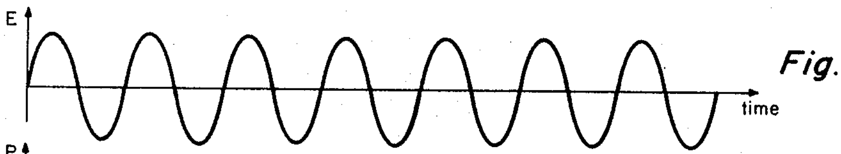
FIGS. 3 to 8 show the various waveforms associated with the embodiment shown in FIG. 1.
Figure 4:
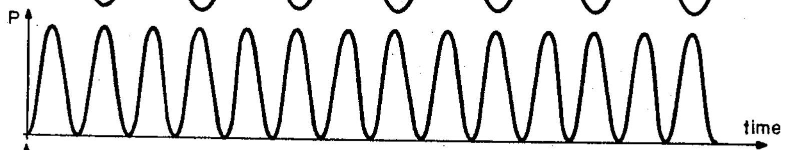

Referring now to the waveforms of FIGS. 3 to 8, the waveform of FIG. 3 shows the unmodulated high frequency electric field existing at tip 14 of probe 10, while the waveform of FIG. 4 indicates the power density in the semiconductor wafer proximate probe 10. It is to be noted that as the power density is proportional to the square of the electric field it will have a positive although varying magnitude throughout an entire period.

Initially, the rate at which power is absorbed by the carriers residing in wafer 11 proximate probe 10 exceeds the rate at which these carriers can transfer this additonal energy to the semiconductor lattice. The average energy of the carriers rises until a new equilibrium condition is reached with the lattice. This equilibrium condition is characterized by a heating of the carriers.

By utilizing a semiconductor material with aforementioned carrier concentration, the carriers are found to have an energy relaxation time in the order of $10^{-11}$ seconds. This time constant is a measure of the time required for the carriers to achieve an equilibrium condition at the new temperature. Also, electromagnetic power density having a frequency greater than the reciprocal of the carrier energy relaxation time will raise the carrier to a substantially constant new temperature level. This is due to the inability of the carriers to absorb and release energy as fast as the periodic high frequency power density in the wafer varies.

Figure 5:
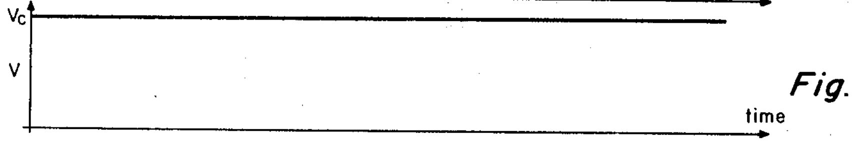

The semiconductor material of wafer 11 has a dielectric relaxation time which is related to the time required for the generation of a thermolectric voltage by carriers experiencing a given change in carrier temperature. This quantity is found to be the product of the D.-C. resistivity of the semiconductor material and the dielectric constant and has a value which may be an order of magnitude smaller than the carrier energy relaxation time. Therefore electromagnetic power density having a frequency greater than either of the reciprocals of the carrier energy relaxation time and the dielectric relaxation time will generate a D.-C. thermoelectric output voltage $V_o$ as shown by the waveform of FIG. 5.

However, for electromagnetic power density having a frequency less than both the reciprocal of the carrier relaxation time and the reciprocal of the dielectric relaxation time, the thermoelectric voltage generated by the diffusion of the carriers varies periodically in substantial correspondence with the power density waveform.

Figure 6:
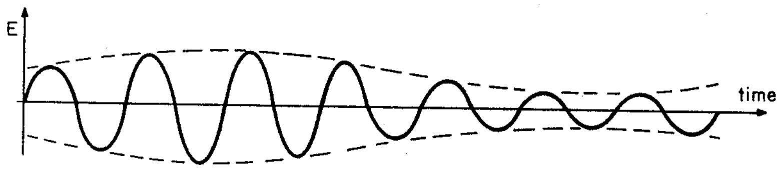
Figure 7:
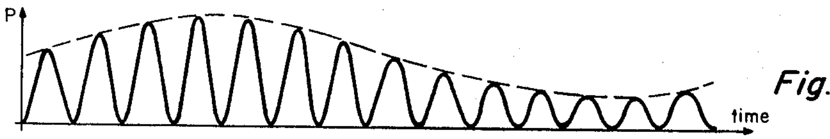
Figure 8:
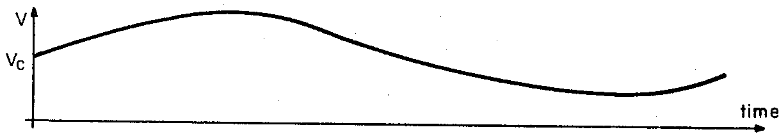

As shown by the waveforms of FIGS. 6, 7, and 8, the invention may be readily employed to demodulate amplitude modulated microwave signals. The frequency of the modulation signal will of course be significantly less than that of the high frequency carrier and therefore will be less than the reciprocals of the carrier energy and dielectric relaxation times. Thus the carrier diffusion is able to follow the variation in power density in wafer 11 arising from the application of the modulated carrier signal shown by the waveform of FIG. 6. This is illustrated by the waveform of FIG. 8 showing the varying thermoelectric output voltage corresponding to the power density of FIG. 7.

The thermoelectric voltage generated between the contacts may be supplied to external indicating means such as D.C. voltmeter, as seen in FIG. 2 wherein indicating means 26 is shown connected to center conductor 31 and waveguide 27. Alternatively, indicating means such as an oscilloscope, responsive to the varying component of the thermoelectric output voltage may be employed to provide an indication of the amplitude modulation on the microwave signal. Also, the output voltage may be supplied to either an audio or video amplifier depending on the type of modulation employed.

In addition, the invention may be employed in a waveguide as a mixer of microwave signals therein whose difference frequency is less than the reciprocals of the carrier energy relaxation time and the dielectric relaxation time. The thermoelectric voltage generated will then have a frequency equivalent to this difference frequency.

The sensitivity of the device is dependent on the amount of power absorbed per individual carrier and therefore is determined primarily by the majority carrier concentration proximate the small area contact and the cross-sectional area of the small area contact. In one particular embodiment made of p-type germanium wafer with gallium doping and tested and operated at a frequency of 9 gigacycles, the diameter of the probe 10 was 0.2 mil, the diameter of the contact 12 was 20 mils and the carrier concentration substantially $10^{14}$ carriers per cubic centimeter. The embodiment used in conjunction with a D.C. voltmeter was found to detect signal levels as low as $10^{-9}$ watts with bandwidths of 1 megacycle while being able to operate at peak power levels in the tens of watts range. The output voltage generated is in the range of 1 to 10 millivolts for input power densities of 1 kilowatt per cubic centimeter depending on the type of semiconductor material employed and its carrier concentration.

Figure 9:
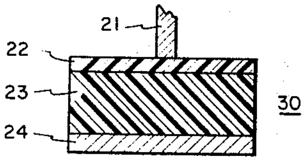
FIG. 9 is a view in section of a second embodiment of the invention.

Another embodiment of the invention is shown in FIG. 9, wherein semiconductor wafer 30 comprises a thin lightly-doped epitaxial layer 22 having a carrier concentration less than $10^{16}$ carriers per cubic centimeter on one surface of heavier doped extrinsic semiconductor base 23. Both base 23 and epitaxial layer 22 have the same majority carrier and differ only in their respective carrier concentrations. Metal post 21 forms a noninjecting contact with layer 21, while metal base contact 24 is similar to metal base contact 12. As in the first mentioned embodiment, the contact area of base contact 24 is substantially greater than the contact area of post 21.

The operation of the two embodiments and the output waveforms are similar. The principal advantage of this embodiment lies in the fact that it is possible to obtain epitaxial layers of smaller thickness than the major dimension of the contact area of the non-injecting contact. Therefore the carriers in the lightly-doped epitaxial layer experience a greater increase in average energy for equivalent power inputs, while the carriers in the more heavily-doped semiconductor base 23 remain in substantial thermal equilibrium with their lattice. Hence, the second embodiment may be used where increased sensitivity is desired.

In both embodiments, the thermoelectric voltage is generated between the two contacts and may be easily read by connecting a suitable indicating device thereacross. It will be understood that the polarity of the thermoelectric output voltage will depend on the majority carrier employed and that for n-type material the small area contact will be positive with respect to the broad area contact.

While the above discussion has described two embodiments of the invention, it is understood that many changes in these embodiments may be made within the spirit and scope of the invention and that other embodiments utilizing the principles of the invention may be made.

What is claimed is:

1. Apparatus for detecting microwave power in a waveguide which comprises (a) a wafer of extrinsic semiconductor material having a carrier concentration of not more than $10^{16}$ carriers per cubic centimeter, (b) a non-injecting probe contacting one face of said wafer, (c) an ohmic contact mounted on the opposing face of said wafer and having a contact area at least 10 times as large as the contact area of said probe, and (d) means for mounting said wafer probe and contact in the waveguide with said probe being positioned at a point of maximum field intensity therein, a voltage which is a function of the microwave power in the waveguide being generated between said probe and contact.

2. Apparatus for detecting microwave power in a waveguide which comprises (a) a wafer of semiconductor material having a carrier concentration of not more than $10^{16}$ carriers per cubic centimeter, (b) a non-injecting probe contacting one face of said wafer, (c) a low impedance metallic contact mounted on the opposing face of said wafer, said metallic contact having a contact area at least 10 times larger than said non-injecting probe, and (d) means for mounting said wafer, probe and contact in the waveguide with said probe being positioned at a point of maximum field intensity therein, a thermoelectric voltage which is a function of the microwave power in the waveguide being generated between said probe and contact.

3. Apparatus for detecting microwave power in a waveguide which comprises (a) a semiconductor base, (b) an epitaxial layer located on one face of said base to form a semiconductor wafer having a uniform majority carrier, said layer being lightly doped in relation to said base and having a carrier concentration of not more than $10^{16}$ carriers per cubic centimeter, (c) an ohmic contact mounted on the epitaxial layer of said wafer, (d) a low impedance metallic contact mounted on the opposing face of said wafer and having a contact area at least 10 times as large as said ohmic contact, and (e) means for positioning said wafer, layer and contacts in a waveguide, a voltage which is a function of the microwave power in the waveguide being generated between said contacts.

4. Apparatus for detecting microwave power in a waveguide which comprises (a) a semiconductor base,
(b) an epitaxial layer formed on one face of said base to form a semiconductor wafer having a uniform majority carrier, said layer being lightly-doped in relation to said base and having a carrier concentration of not more than $10^{16}$ carriers per cubic centimeter,
(c) a non-injecting probe contacting the epitaxial layer of said wafer,
(d) an ohmic contact mounted on the opposing face of said wafer and having a contact area at least 10 times as large as the contact area of said probe, and
(e) means for mounting said wafer, probe and contact in the waveguide with said probe being positioned at a point of maximum field intensity therein, a voltage which is a function of the microwave power in the waveguide being generated between said probe and contact.

References Cited by the Examiner

UNITED STATES PATENTS

| | | | |
|---|---|---|---|
| 2,402,663 | 6/1946 | Ohl | 329—201 X |
| 2,974,223 | 3/1961 | Langberg | 307—88.5 |
| 2,984,775 | 5/1961 | Matlow et al. | 317—234.5 |
| 3,191,061 | 6/1965 | Weimer | 307—88.5 |

ROY LAKE, *Primary Examiner.*

A. L. BRODY, *Assistant Examiner.*